(12) United States Patent
Torii

(10) Patent No.: US 6,550,049 B1
(45) Date of Patent: Apr. 15, 2003

(54) SEMICONDUCTOR INTEGRATED CIRCUIT AND METHOD OF DESIGNING THE SAME

(75) Inventor: Kensuke Torii, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/592,244

(22) Filed: Jun. 13, 2000

(30) Foreign Application Priority Data

Jun. 14, 1999 (JP) .......................................... 11-166937
Jun. 5, 2000 (JP) ...................................... 2000-167839

(51) Int. Cl.$^7$ ............................................ G06F 17/50
(52) U.S. Cl. ......................................... 716/13; 716/10
(58) Field of Search ....................... 716/1–21

(56) References Cited

U.S. PATENT DOCUMENTS

| | | | |
|---|---|---|---|
| 4,811,237 A | * 3/1989 | Putatunda et al. | 716/9 |
| 5,623,420 A | * 4/1997 | Yee et al. | 716/1 |
| 5,822,214 A | * 10/1998 | Rostoker et al. | 716/10 |
| 6,058,257 A | * 5/2000 | Nojima | 716/12 |
| 6,083,271 A | * 7/2000 | Morgan | 716/1 |
| 6,114,903 A | * 9/2000 | Bach | 327/565 |
| 6,175,952 B1 | * 1/2001 | Patel et al. | 716/18 |
| 6,202,191 B1 | * 3/2001 | Filippi et al. | 716/5 |
| 6,260,184 B1 | * 6/2001 | Brennan et al. | 716/14 |
| 6,308,307 B1 | * 10/2001 | Cano et al. | 716/8 |
| 6,336,207 B2 | * 1/2002 | Shinomiya et al. | 716/11 |
| 6,367,061 B1 | * 4/2002 | Kurokawa et al. | 716/10 |
| 6,405,354 B1 | * 6/2002 | Itazu et al. | 716/8 |

OTHER PUBLICATIONS

Wu et al. ("Design and optimization of power/ground network for cell–based VLSIs with macro cells", Proceedings of the ASP–DAC Asia and South Pacific Design Automation Conference, vol. 1, Jan. 18, 1999, pp. 21–24).*

Cai ("Multi–pads, single layer power net routing in VLSI circuits", Proceedings of 25 th ACM/IEEE Design Automation Conference, Jun. 12, 1988, pp. 183–188).*

* cited by examiner

*Primary Examiner*—Vuthe Siek
*Assistant Examiner*—Phallaka Kik
(74) *Attorney, Agent, or Firm*—Hogan & Hartson, LLP

(57) ABSTRACT

A method of designing a semiconductor integrated circuit that makes it possible to reduce the manual work during the layout of power wiring. A first encircling power wire for supplying power to circuitry within a first circuit block, such as a memory block, is placed within that block. A second encircling power wire for supplying power to a random logic circuit block is placed to have a complicated shape, in order to avoid crossing the first encircling power wire. Two edges of the second encircling power wire are placed within the first circuit block. These two edges form a bent portion. By using these two edges for a portion that has a complicated shape of the second encircling power wire, it becomes possible to automate the routing of the other four edges of the second encircling power wire.

55 Claims, 11 Drawing Sheets ered by automated routing alone. Thus the designers have to do all or part of the work of laying out the power wiring manually. The result is an increase in the time required for power wiring layout.

SEMICONDUCTOR INTEGRATED CIRCUIT AND METHOD OF DESIGNING THE SAME

BACKGROUND OF THE INVENTION

1. Field of the Invention

This invention relates to a semiconductor integrated circuit such as a standard cell, and a method of design thereof.

2. Description of Related Art

Automated design techniques for automatically determining the placement and routing of semiconductor integrated circuits have recently improved so much, this automatic design is widely used in the semi-customized IC such as standard cells. However, if several circuits such as macro cells are formed on the same semiconductor substrate, it often happens that the power system of the power wiring for one circuit is required to be separated from that of another circuit. For example, if the operating voltage of one circuit differs from that of another circuit, the power wiring that supplies power to one circuit is required to be separated from the power wiring that supplies power to the other circuit. The shape of the power wiring becomes complicated, to ensure that the power wires do not cross. Such power wires cannot be laid out by automated routing alone. Thus the designers have to do all or part of the work of laying out the power wiring manually. The result is an increase in the time required for power wiring layout.

SUMMARY OF THE INVENTION

An objective of this invention is to provide a semiconductor integrated circuit and a method of design thereof that makes it possible to reduce, or even eliminate, the manual work that must be done by the designers in addition to the automated routing of power wiring.

(1) This invention relates to a method of designing a semiconductor integrated circuit which comprises a circuit block, a first power wire for supplying power to circuitry within the circuit block, and a second power wire of a power system that differs from a power system of the first power wire, wherein the first power wire and a third power wire are provided within the circuit block; and wherein the third power wire has a bent portion, is separated from the first power wire, and has the same power system as the second power wire; and wherein the method of designing a semiconductor integrated circuit comprises:

a first step of determining the position of the circuit block; and a second step of automatically placing the second power wire in such a manner that the second power wire is connected to the third power wire after the first step.

Examples of power systems with different power wires are given below. If the operating voltage of one circuit differs from that of another circuit, the power wire of one circuit will have a power system that differs from that of the power wire of the other circuit. Similarly, if one circuit is a digital circuit and another circuit is an analog circuit, the power wire of one circuit will have an power system that differs from that of the power wire of the other circuit, even if they use the same voltage.

This aspect of the invention makes it possible to have a power system for one wire that comprises the second power wire and the third power wire. This aspect of the invention also makes it possible to reduce, or even eliminate, the work of laying out the power wiring manually, even if that one power wire has a complicated shape such as a polygonal shape with five or more sides. In other words, since the third power wire has a bent portion such as a corner portion, this third power wire can be used to form a portion that has a complicated shape for that one power wire, making it possible to layout the second power wire automatically.

This invention also relates to a semiconductor integrated circuit comprising a circuit block, a first power wire for supplying power to circuitry within the circuit block, and a second power wire of a power system that differs from a power system of the first power wire, formed on the same semiconductor substrate, wherein the first power wire and a third power wire are provided within the circuit block; and wherein the third power wire has a bent portion, is separated from the first power wire, and has the same power system as the second power wire. The method of designing a semiconductor integrated circuit in accordance with this aspect of the invention, can be used in the design of such a semiconductor integrated circuit.

(2) In the semiconductor integrated circuit and method of design thereof in accordance with this invention, the third power wire may be placed on an outer side of the first power wire.

(3) In the semiconductor integrated circuit and method of design thereof in accordance with this invention, the third power wire may comprise: a first edge that extends in a first direction and is connected to the second power wire that extends in a second direction; and a second edge that extends in the second direction and is connected to the first edge.

"First direction" means a first priority routing direction during the automated wiring, by way of example. "Second direction" means a second priority routing direction during the automated routing, by way of example.

(4) In the semiconductor integrated circuit and method of design thereof in accordance with this invention, the circuit block may be integrated with an I/O port for the circuit block. This makes it possible to reduce the work of connecting the circuitry of the circuit block to the I/O port for that circuit block, during the automated routing stage.

(5) In the semiconductor integrated circuit and method of design thereof in accordance with this invention that was described in (4), the first edge and the second edge may be provided between the I/O port and another I/O port. This simplifies the separation of power systems for the power wires for the I/O port and the other I/O port.

(6) In the semiconductor integrated circuit and method of design thereof in accordance with this invention, the third power wire may comprise:

a first edge that extends in a first direction and is connected to the second power wire that extends in a second direction;

a second edge that extends in the second direction and is connected to the first edge;

a third edge that extends in the first direction and is connected to the second edge; and a fourth edge that extends in the second direction and is connected to the first and third edges;

such that the first power wire is surrounded by the first to fourth edges.

The first to fourth edges are formed to surround the first power wire. Therefore, any of the first to fourth edges can be freely selected in accordance with the position of the circuit block, for connection to the second power wire. It is therefore possible to place the circuit block at any position within the semiconductor integrated circuit region.

(7) In the semiconductor integrated circuit and method of design thereof in accordance with this invention, the first power wire may comprise an encircling power wire. An encircling power wire is a power wire such that one end portion is connected to the other end portion thereof. The shape of the encircling power wire could have a circular form or a rectangular form, by way of example.

(8) In the semiconductor integrated circuit and method of design thereof in accordance with this invention, the second power wire and the third power wire may form another encircling power wire.

(9) In the semiconductor integrated circuit and method of design thereof in accordance with this invention, a potential supplied by the first power wire may differ from a potential supplied by a power wire that comprises the second power wire and the third power wire.

(10) In the semiconductor integrated circuit and method of design thereof in accordance with this invention, a potential supplied by the first power wire may be the same as a potential supplied by a power wire that comprises the second power wire and the third power wire.

(11) In the semiconductor integrated circuit and method of design thereof in accordance with this invention, the circuit block may comprise a macro cell.

(12) In the semiconductor integrated circuit and method of design thereof in accordance with this invention, the circuit block may comprise at least one of ROM, RAM, an analog circuit, a control circuit, and an interface circuit.

(13) The semiconductor integrated circuit and method of design thereof in accordance with this invention may further comprise a step of determining a position of another circuit block supplied with power by a power wire that comprises the second power wire and the third power wire, between the first step and the second step.

(14) In the semiconductor integrated circuit and method of design thereof in accordance with this invention, the other circuit block may comprise a macro cell.

(15) In the semiconductor integrated circuit and method of design thereof in accordance with this invention, the other circuit block may comprise a random logic circuit.

(16) In a method of designing a semiconductor integrated circuit in accordance with this invention, information on the circuit block, information on the other circuit block, information on the first power wire, information on the second power wire, and information on the third power wire may be stored in a library.

(17) In a method of designing a semiconductor integrated circuit in accordance with this invention, positions of the circuit block and the other circuit block may be determined by automatic placement.

(18) In the semiconductor integrated circuit and method of design thereof in accordance with this invention, the semiconductor integrated circuit may comprise at least one of a standard cell, a gate array, and an embedded array.

DETAILED DESCRIPTION OF THE PREFERRED EMBODIMENTS

First Embodiment

Figure 7:
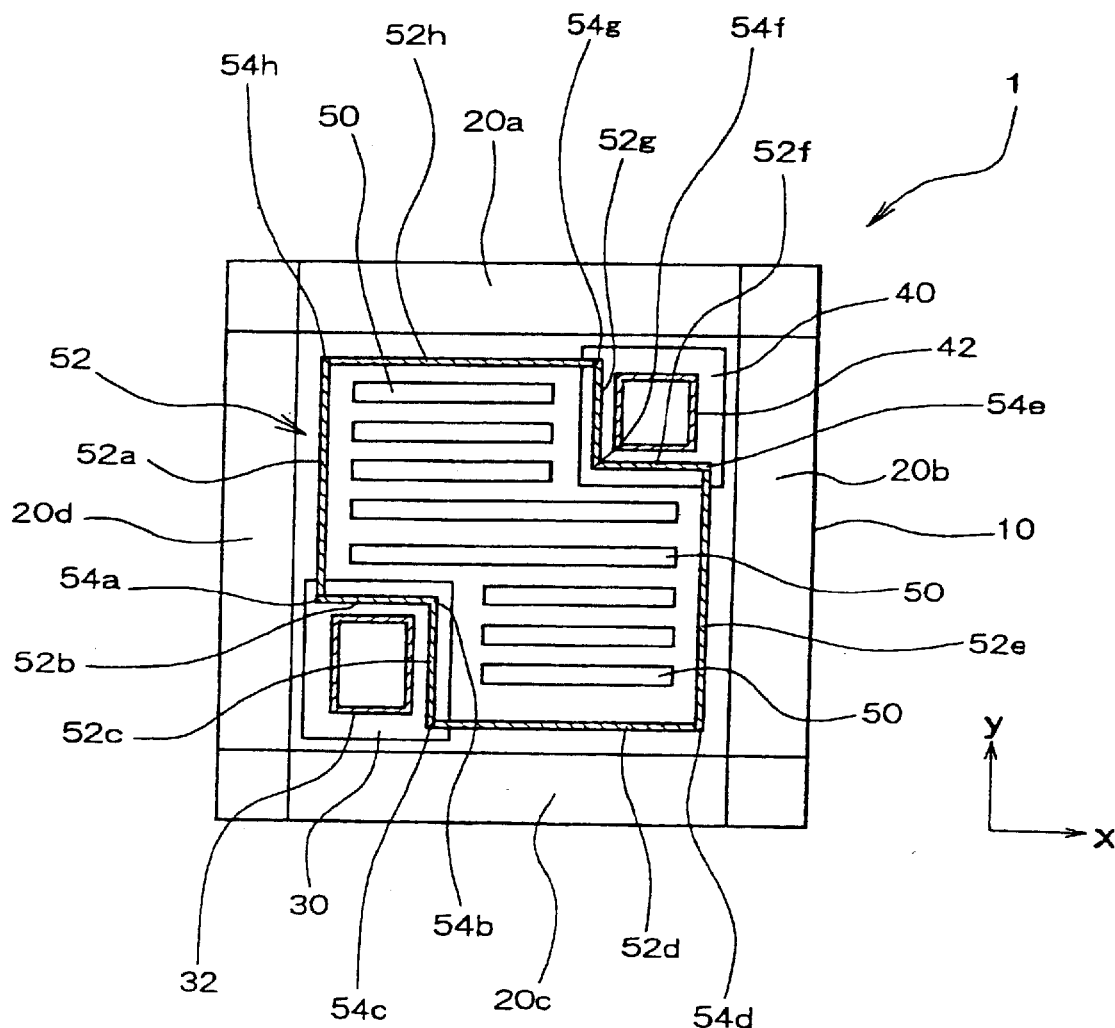
FIG. 7 is a plan view of the semiconductor integrated circuit 1 in accordance with the first embodiment of this invention.

A first embodiment of this invention will now be described with reference to the accompanying drawings. A plan view of a semiconductor integrated circuit 1 in accordance with the first embodiment of the invention is shown in FIG. 7. The semiconductor integrated circuit 1 comprises I/O ports 20a, 20b, 20c, and 20d; a first circuit block 30; a second circuit block 40, and a large number of random logic circuit blocks 50. These components are formed within an integrated circuit design region 10 of the semiconductor integrated circuit 1. The integrated circuit design region 10 can be of any shape, but in this embodiment it is rectangular.

The I/O ports 20a, 20b, 20c, and 20d are placed around the periphery of the integrated circuit design region 10. Each of these I/O ports functions as at least one of an input and an output port.

The first circuit block 30 and the second circuit block 40 are placed on a diagonal line across the integrated circuit design region 10. In other words, the first circuit block 30 is placed in a region that is further inward from a corner portion of the integrated circuit design region 10 defined by the I/O port 20c and the I/O port 20d. The second circuit block 40 is placed in a region that is further inward from a corner portion of the integrated circuit design region 10 defined by the I/O port 20a and the I/O port 20b. The first circuit block 30 and the second circuit block 40 are memory and analog circuitry, by way of example. Note that the first circuit block 30 and the second circuit block 40 can be of any shape, but in this embodiment they are rectangular. In addition, the first circuit block 30 and the second circuit block 40 are shown to be rectangles of different sizes, but they could equally well be of the same size. In addition, only one of the first circuit block 30 and the second circuit block 40 need be provided, or other circuit blocks could be provided.

The first circuit block 30 and the second circuit block 40 are provided with encircling power wires 32 and 42, respectively. An encircling power wire is a power wire such that one end portion is connected to the other end portion thereof. The encircling power wire 32 is positioned on the outer side of the circuitry of the first circuit block 30 (memory, or the like) and supplies power to that circuitry. Similarly, the encircling power wire 42 is positioned on the outer side of the circuitry of the second circuit block 40 (memory, or the like) and supplies power to that circuitry. Since the positions of power wires within the circuitry of the first circuit block 30 and the second circuit block 40 are not known, the encircling power wires 32 and 42 are placed on the outer side of the circuitry. This ensures that the power wires within the circuitry can connect to the encircling power wire, regardless of the positions of the power wires within the circuitry. Note that the encircling power wires 32 and 42 can be of any shape, but in this embodiment they form a rectangular framework. The encircling power wires 32 and 42 each form a set of a $V_{DD}$ wire and a $V_{SS}$ wire, respectively. One of the $V_{DD}$ wire and the $V_{SS}$ wire is positioned on an inner side and the other is positioned on an outer side. Note that the encircling power wires 32 and 42 could be replaced by stripe-shaped power wires.

The plurality of the random logic circuit blocks 50 is within the integrated circuit design region 10, placed outside of the regions in which the I/O ports 20a to 20d, the first circuit block 30, and the second circuit block 40 are placed. The random logic circuit blocks 50 are macro cells which can be supplied with power from a source in the same power system as the other circuits, such as medium scale integrated circuit (MSI) cells. The random logic circuit blocks 50 can be of any shape, but in this embodiment they are long, thin rectangles with the longitudinal direction thereof being in the X-direction.

An encircling power wire 52 is placed on the outer side of the region in which the random logic circuit blocks 50 are formed (hereinafter called the circuit blocks 50 region), so as to surround that region. The encircling power wire 52 consists of edges 52a to 52h, as described below, and supplies power to the random logic circuit blocks 50.

1. The edge 52a extends in the Y-direction in the figure and is placed between the I/O port 20d and the circuit blocks 50 region.

2. The edge 52b is connected to the edge 52a at a corner portion 54a and extends in the X-direction in the figure. The edge 52b is placed between the encircling power wire 32 and the circuit blocks 50 region.

3. The edge 52c is connected to the edge 52b at a corner portion 54b and extends in the Y-direction in the figure. The edge 52c is placed between the encircling power wire 32 and the circuit blocks 50 region.

4. The edge 52d is connected to the edge 52c at a corner portion 54c and extends in the X-direction in the figure. The edge 52d is placed between the I/O port 20c and the circuit blocks 50 region.

5. The edge 52e is connected to the edge 52d at a corner portion 54d and extends in the Y-direction in the figure. The edge 52e is placed between the I/O port 20b and the circuit blocks 50 region.

6. The edge 52f is connected to the edge 52e at a corner portion 54e and extends in the X-direction in the figure. The edge 52f is placed between the encircling power wire 42 and the circuit blocks 50 region.

7. The edge 52g is connected to the edge 52f at a corner portion 54f and extends in the Y-direction in the figure. The edge 52g is placed between the encircling power wire 42 and the circuit blocks 50 region.

8. The edge 52h is connected to the edge 52g at a corner portion 54g and to the edge 52a at a corner portion 54h, and extends in the X-direction in the figure. The edge 52h is placed between the I/O port 20a and the circuit blocks 50 region. Note that the X-direction is merely an example of a first priority routing direction for the automated routing. Similarly, the Y-direction is merely an example of a second priority routing direction for the automated routing.

Each of the encircling power wire 32 of the first circuit block 30, the encircling power wire 42 of the second circuit block 40, and the encircling power wire 52 of the random logic circuit blocks 50 is of a different power system, so they are mutually separated. Two reasons for this are given below, by way of example. The first reason is because the voltage at which one circuit block operates may differ from the voltage at which other circuit blocks operate. The second is that it may be necessary to separate power wires that are at the same voltage, for analog circuitry and logic circuitry, by way of example.

Note that the power wire that supplies power to the circuitry of the random logic circuit blocks 50 is the encircling power wire 52, but it can be configured to not have the edges 52d and 52h, or not have the edges 52a and 52e. Such choices can be selected in accordance with the positions of power wires within the circuitry of the random logic circuit blocks 50.

The edges 52b and 52c of the encircling power wire 52 are placed within the first circuit block 30 and the edges 52f and 52g of the encircling power wire 52 are placed within the second circuit block 40. This is one characteristic of this embodiment of the invention. The effects thereof will be discussed later.

Figure 1:
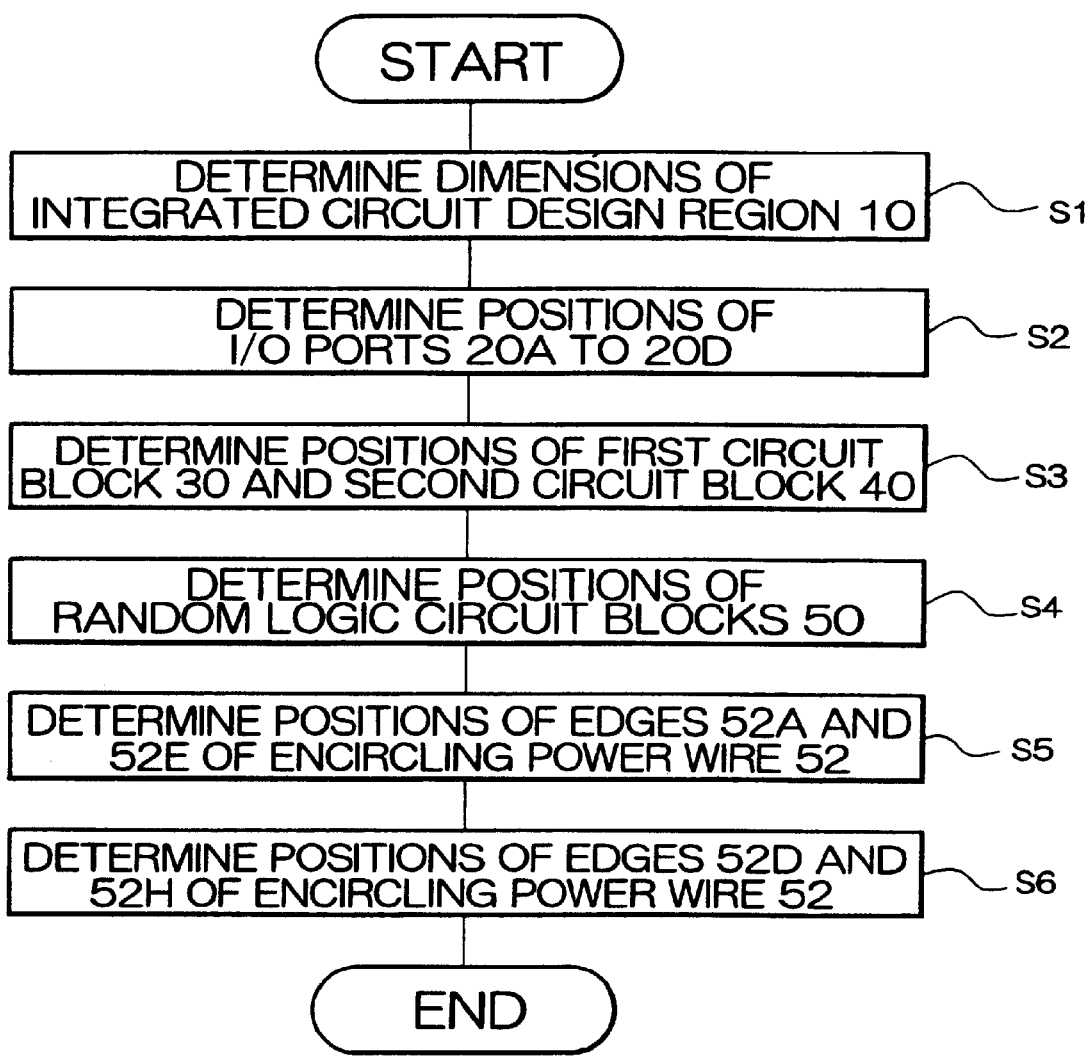
FIG. 1 is a flowchart of a method of designing a semiconductor integrated circuit 1 in accordance with a first embodiment of this invention.

The method of designing the semiconductor integrated circuit 1 in accordance with the first embodiment of this invention will now be described with reference to FIGS. 1 to 7. FIG. 1 is a flowchart of the method of designing the semiconductor integrated circuit 1. FIGS. 2 to 6 are plan views of the integrated circuit design region 10 during the various stages of the design of the semiconductor integrated circuit 1. This first embodiment of the invention relates to a method of designing standard cells by automated placement and routing. In other words, this is a method of using an automated placement-routing program to design the layout of standard cells. In this embodiment, it is assumed that the I/O ports 20a to 20d, the first circuit block 30, the second circuit block 40, the random logic circuit blocks 50 had been stored in a cell library beforehand.

Note that, in this document, the automated placement and routing refers to the process of laying out the circuit blocks and wiring, including power wiring, automatically. Automated wiring refers to the process of laying out wiring, including power wires, automatically. Automatic placement refers to the process of laying out circuit blocks automatically.

Figure 2:
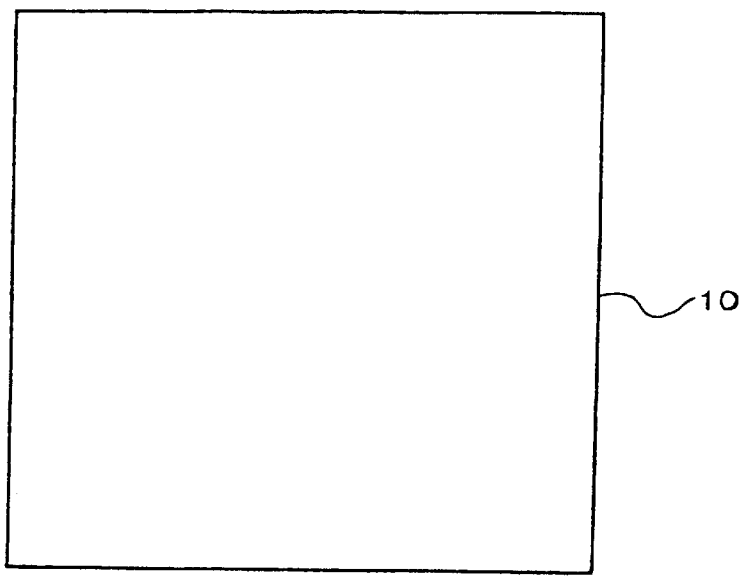
FIG. 2 is a plan view of an integrated circuit design region 10 in a first design step of the semiconductor integrated circuit 1 in accordance with the first embodiment of this invention.

First of all, the dimensions of the integrated circuit design region 10 are determined, as shown in FIG. 2 (step S1). The integrated circuit design region 10 is equivalent to the main surface of a semiconductor substrate in which a semiconductor integrated circuit is formed.

Figure 3:
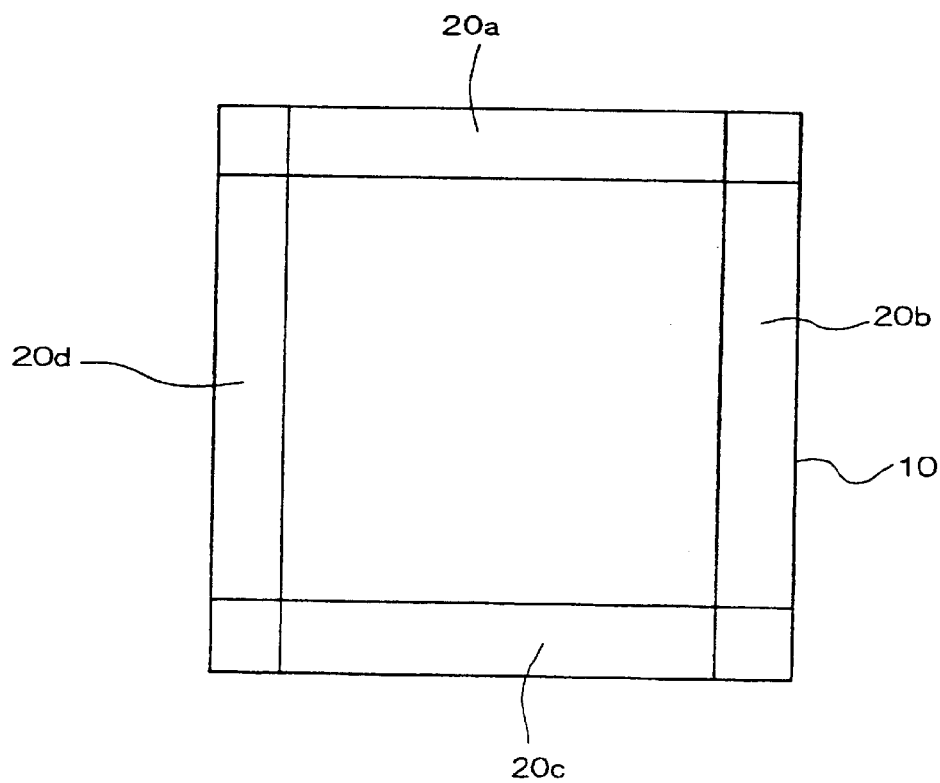
FIG. 3 is a plan view of an integrated circuit design region 10 in a second design step of the semiconductor integrated circuit 1 in accordance with the first embodiment of this invention.

The positions of the I/O ports 20a, 20b, 20c, and 20d are then determined by the automated placement and routing program along the four edges of the integrated circuit design region 10, as shown in FIG. 3 (step S2).

Figure 4:
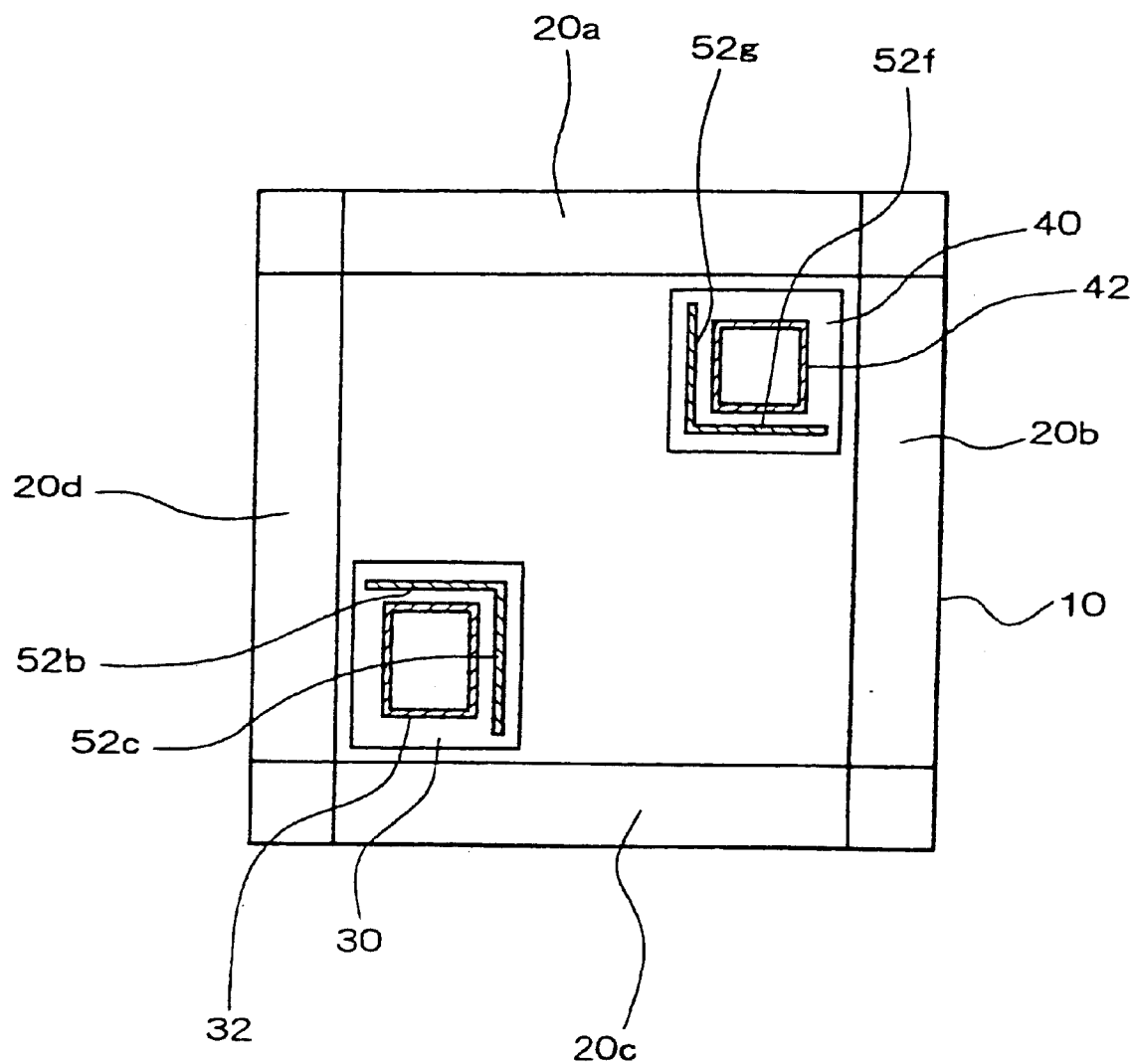
FIG. 4 is a plan view of an integrated circuit design region 10 in a third design step of the semiconductor integrated circuit 1 in accordance with the first embodiment of this invention.

The positions of the first circuit block 30 and the second circuit block 40 are determined by the automated placement-routing program, as shown in FIG. 4 (step S3). Either the position of the first circuit block 30 is determined first, followed by the position of the second circuit block 40, or this positioning could be done in reverse order.

The first circuit block 30 is provided with the encircling power wire 32 for supplying power to the circuitry of the first circuit block 30 and the edges 52b and 52c of the encircling power wire 52 for supplying power to the random logic circuit blocks 50, which are positioned on the outer side of the encircling power wire 32, and is stored in the cell library. Similarly, the second circuit block 40 is provided with the encircling power wire 42 for supplying power to the circuitry within the second circuit block 40 and the edges 52f and 52g of the random logic circuit blocks 50 for supplying power to the random logic circuit blocks 50, which are positioned on the outer side of the encircling power wire 42, and is stored in the cell library.

Figure 5:
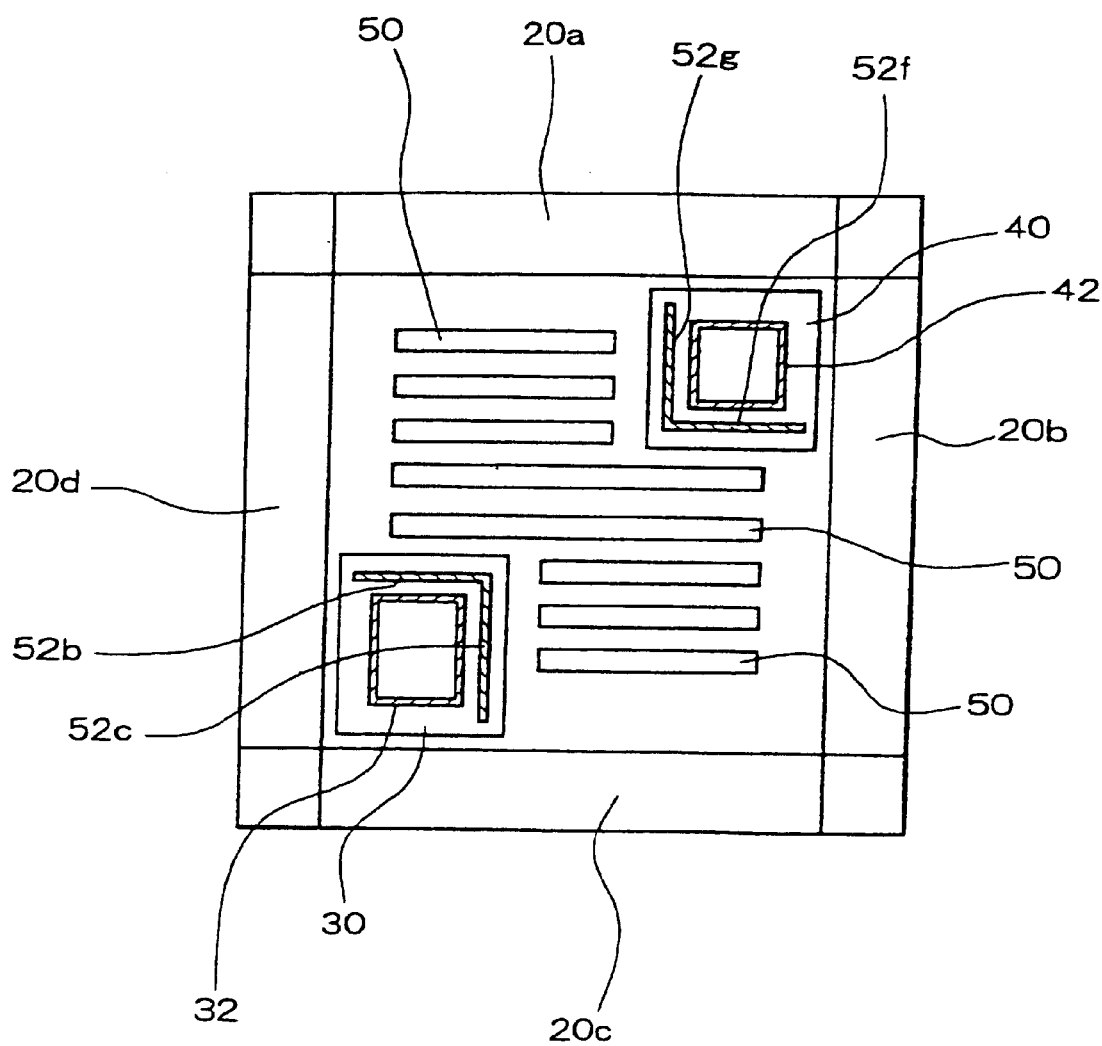
FIG. 5 is a plan view of an integrated circuit design region 10 in a fourth design step of the semiconductor integrated circuit 1 in accordance with the first embodiment of this invention.

The positions of the random logic circuit blocks 50 are then determined by the automated placement-routing program, as shown in FIG. 5 (step S4).

Figure 6:
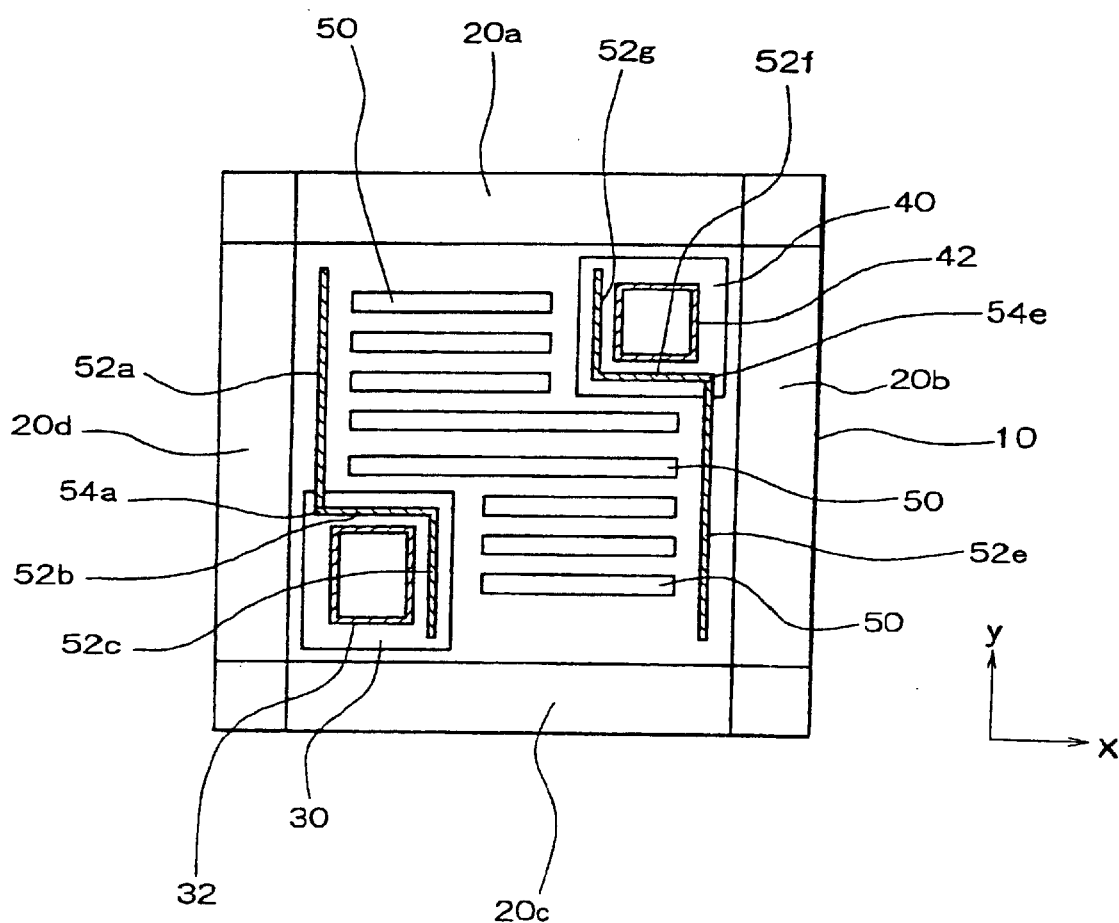
FIG. 6 is a plan view of an integrated circuit design region 10 in a fifth design step of the semiconductor integrated circuit 1 in accordance with the first embodiment of this invention.

The positions of the edges 52a and 52e of the encircling power wire 52 are determined by the automated placement-routing program, as shown in FIG. 6 (step S5). This places the edge 52a so that it is connected to the edge 52b at the corner portion 54a and extends in the Y-direction. Similarly, the edge 52e is connected to the edge 52f at the corner portion 54e and is placed extending in the Y-direction.

The positions of the edges 52d and 52h of the encircling power wire 52 are determined by the automated placement-routing program, as shown in FIG. 7 (step S6). This places the edge 52d so that it is connected to the edge 52c at the corner portion 54c and to the edge 52e at the corner portion 54d, and extends in the X-direction. Similarly, the edge 52h is connected to the edge 52g at the corner portion 54g and to the edge 52a at the corner portion 54h, and is placed extending in the X-direction. Note that the edges 52d and 52h of the encircling power wire 52 could be laid out first, with the edges 52a and 52e of the encircling power wire 52 being laid out afterwards.

This completes the design of the semiconductor integrated circuit 1. The main effects of this embodiment of the invention will now be described. These effects are also achieved by the second embodiment of the invention, which will be described next. As shown in FIG. 7, the encircling power wire 52 has a complicated shape with eight corner portions 54a to 54h. In other words, the placement of the first circuit block 30 means that the corner portion 54a of the encircling power wire 52 bends in the X-direction and the corner portion 54b thereof bends in the Y-direction. Similarly, the placement of the second circuit block 40 means that the corner portion 54e bends in the X-direction and the corner portion 54f thereof bends in the Y-direction. If the encircling power wire 52 is laid out after the first circuit block 30 and the second circuit block 40 have been laid out, therefore, it would be necessary to lay out the edges 52b, 52c, 52f, and 52g manually. With this embodiment of the invention, the edges 52b and 52c are within the first circuit block 30 and the edges 52f and 52g are within the second circuit block 40, making it possible to lay out the encircling power wire 52 by automated wiring, without involving any manual work.

Figure 8:
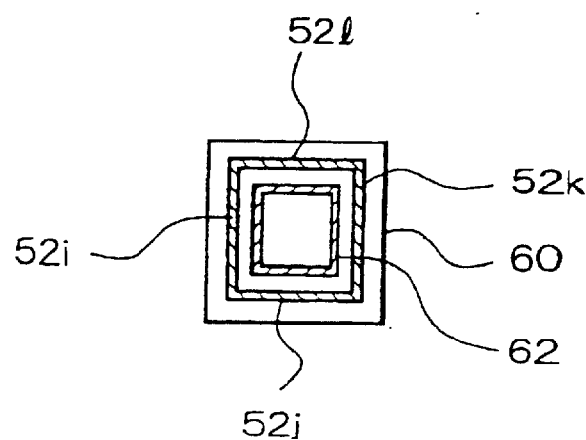
FIG. 8 is a plan view of a modification of the circuit block in accordance with this first embodiment.

Note that a third circuit block 60 that is shown in FIG. 8 is a modification of the first circuit block 30 and the second circuit block 40. The third circuit block 60 has circuitry that is similar to that of the first circuit block 30 or the second circuit block 40. This third circuit block 60 is provided with an encircling power wire 62 for supplying power to the third circuit block 60 and four edges 52i, 52j, 52k, and 52l that can be used to form the encircling power wire 52, separated from the encircling power wire 62. The four edges 52i to 52l are formed in a framework shape and are placed on an outer side of the encircling power wire 62.

During the automated wiring of the encircling power wire 52, any edges selected from the four edges 52i to 52l can become structural components of the encircling power wire 52. Since the third circuit block 60 is provided with these four edges 52i to 52l, it can be placed at any position in the integrated circuit design region 10.

Note that the placement of the I/O ports 20a to 20d, the first circuit block 30, the second circuit block 40, and the random logic circuit blocks 50 was described as being done automatically in this embodiment of the invention, but they could also be placed manually.

Second Embodiment

Figure 13:
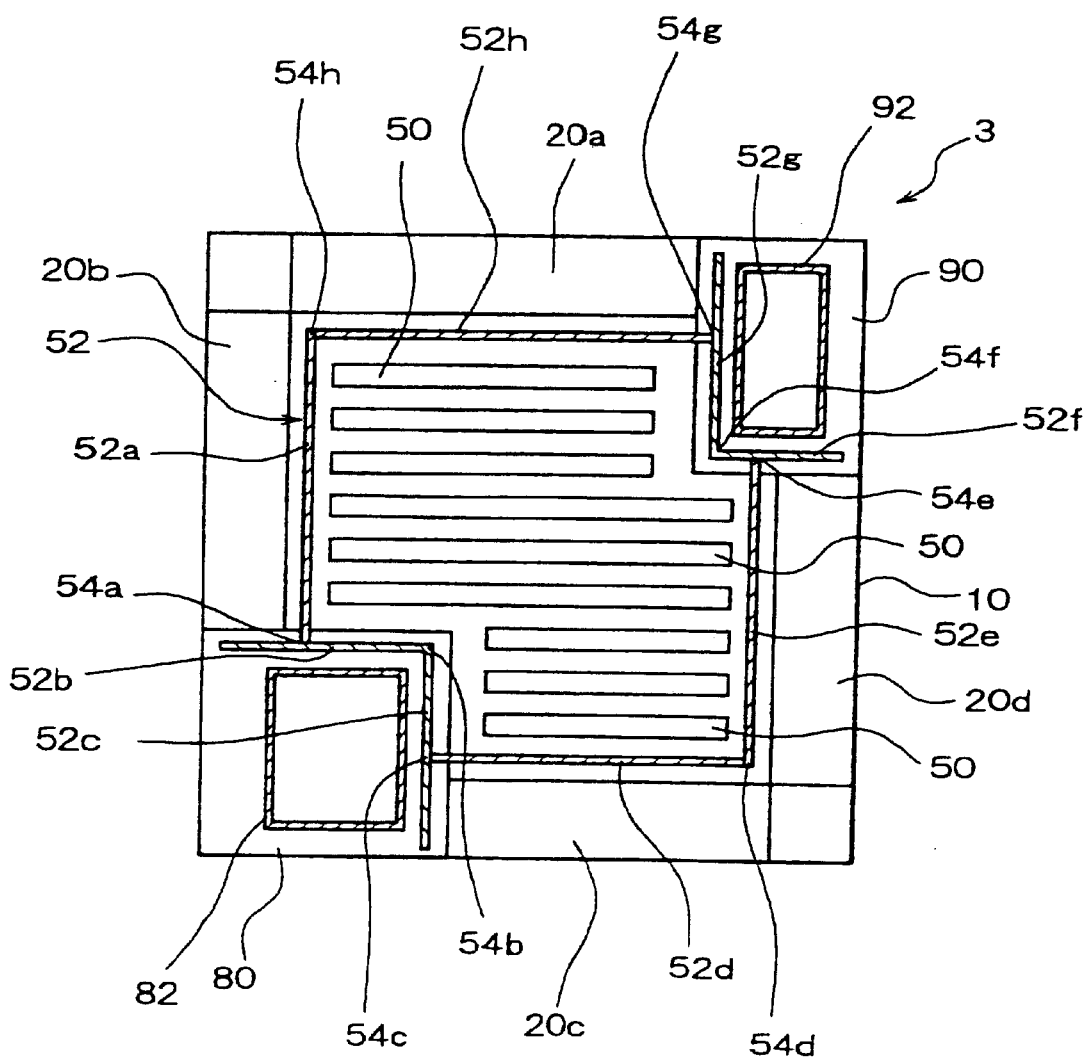
FIG. 13 is a plan view of the semiconductor integrated circuit 3 in accordance with the second embodiment of this invention.

The description now turns to a second embodiment of this invention, with reference to the accompanying drawings. A plan view of a semiconductor integrated circuit 3 in accordance with the second embodiment of this invention is shown in FIG. 13. This description of the semiconductor integrated circuit 3 mainly focuses on differences from the semiconductor integrated circuit 1 of the first embodiment of this invention, shown in FIG. 7. Note that structural components that are the same as those in the semiconductor integrated circuit 1 are denoted by the same reference numbers.

The semiconductor integrated circuit 3 is provided with a first circuit block 80 and a second circuit block 90 that are rectangles of mutually different shapes. The first circuit block 80 is configured to comprise an I/O port for the first circuit block 80. A power wire for this I/O port is connected to a power wire for the circuitry of the first circuit block 80. The first circuit block 80 comprises circuitry that is similar to that of the first circuit block 30, an encircling power wire 82 for supplying power thereto, and the edges 52b and 52c of the encircling power wire 52.

The second circuit block 90 is configured to comprise an I/O port for the second circuit block 90. A power wire for this I/O port is connected to a power wire for the circuitry of the second circuit block 90. The second circuit block 90 comprises circuitry that is similar to that of the second circuit block 40, an encircling power wire 92 for supplying power thereto, and the edges 52f and 52g of the encircling power wire 52.

The first circuit block 80 and the second circuit block 90 are placed in corners of the integrated circuit design region 10, in such a manner as to be on a diagonal line across the integrated circuit design region 10. Since the first circuit block 80 and the second circuit block 90 are positioned in this manner, the I/O ports 20a to 20d are shortened by equivalent amounts. The I/O ports 20a to 20d are for the circuitry of the random logic circuit blocks 50, so the power wires of the I/O port for the first circuit block 80 and the I/O port for the second circuit block 90 are separated therefrom.

The method of designing the semiconductor integrated circuit 3 in accordance with this second embodiment of the invention will now be described with reference to FIGS. 9 to 13. FIGS. 9 to 12 are plan views of the integrated circuit design region 10 during the various stages of the design of the semiconductor integrated circuit 3. The design method of this second embodiment is a method of designing standard cells by the automated placement and routing and is similar to the design method of the first embodiment of this invention, so it is described only briefly.

Figure 9:
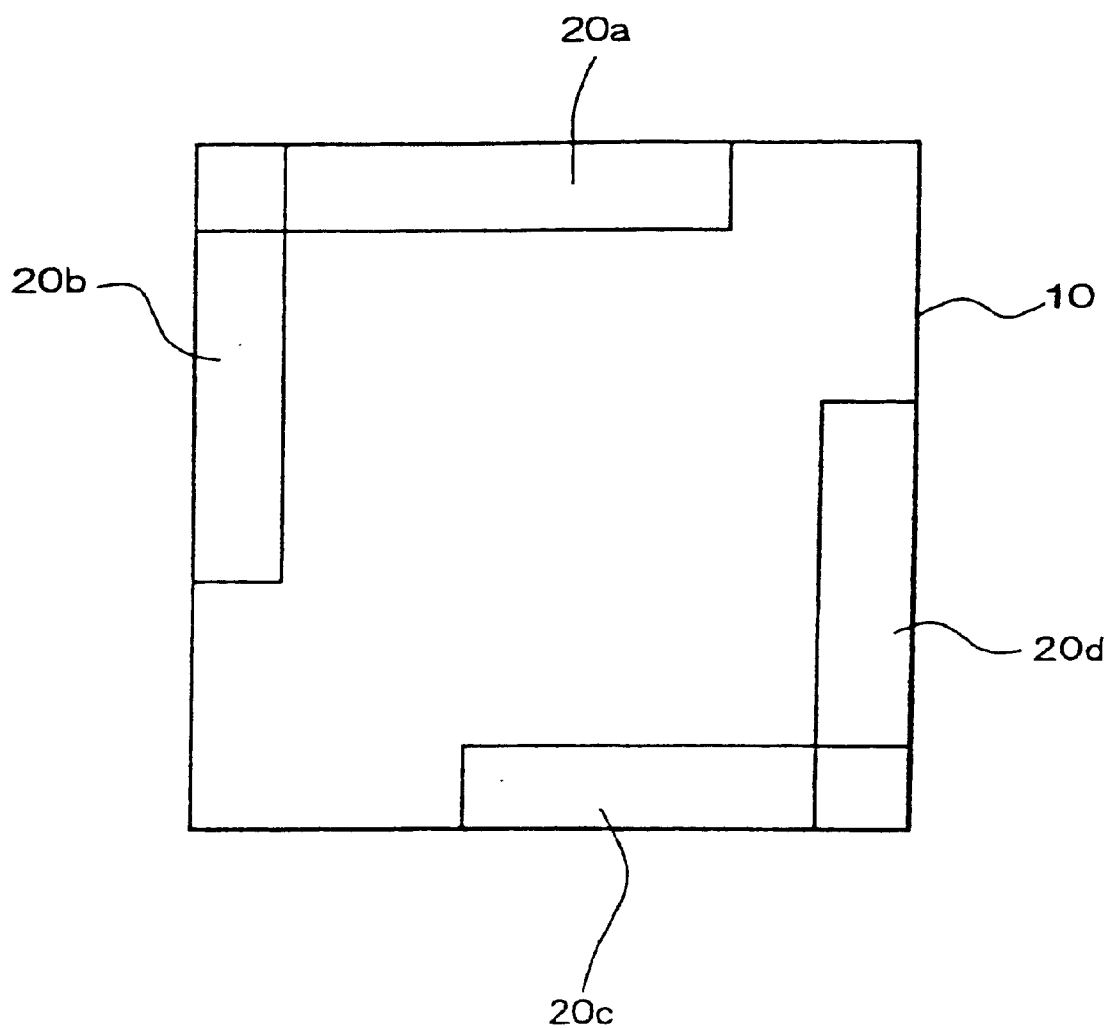
FIG. 9 is a plan view of an integrated circuit design region 10 in a first design step of the semiconductor integrated circuit 3 in accordance with a second embodiment of this invention.

First of all, the positions of the I/O ports 20a, 20b, 20c, and 20d are determined by the automated placement-routing program along the four edges of the integrated circuit design region 10, as shown in FIG. 9.

Figure 10:
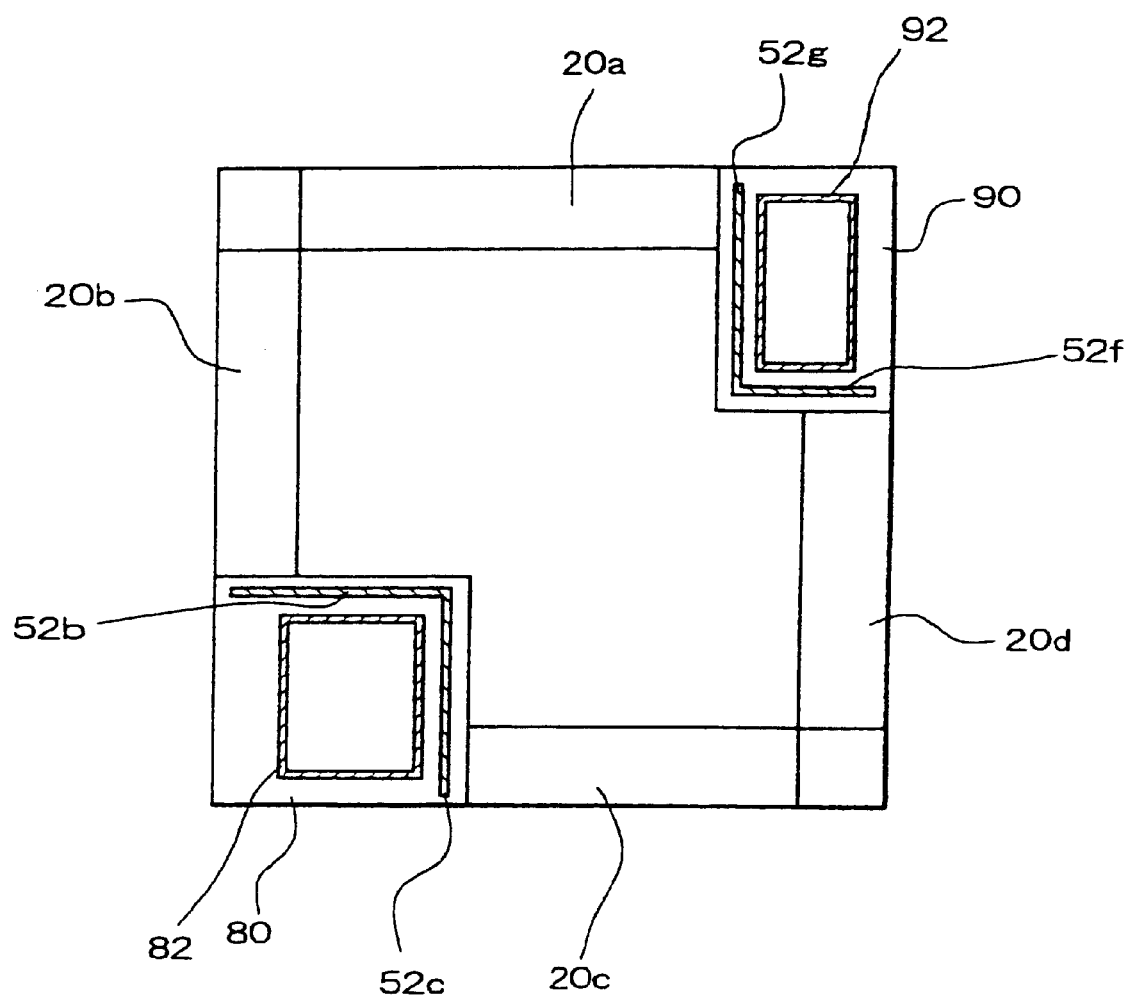
FIG. 10 is a plan view of an integrated circuit design region 10 in a second design step of the semiconductor integrated circuit 3 in accordance with the second embodiment of this invention.

The positions of the first circuit block 80 and the second circuit block 90 are then determined by the automated placement-routing program, as shown in FIG. 10.

Figure 11:
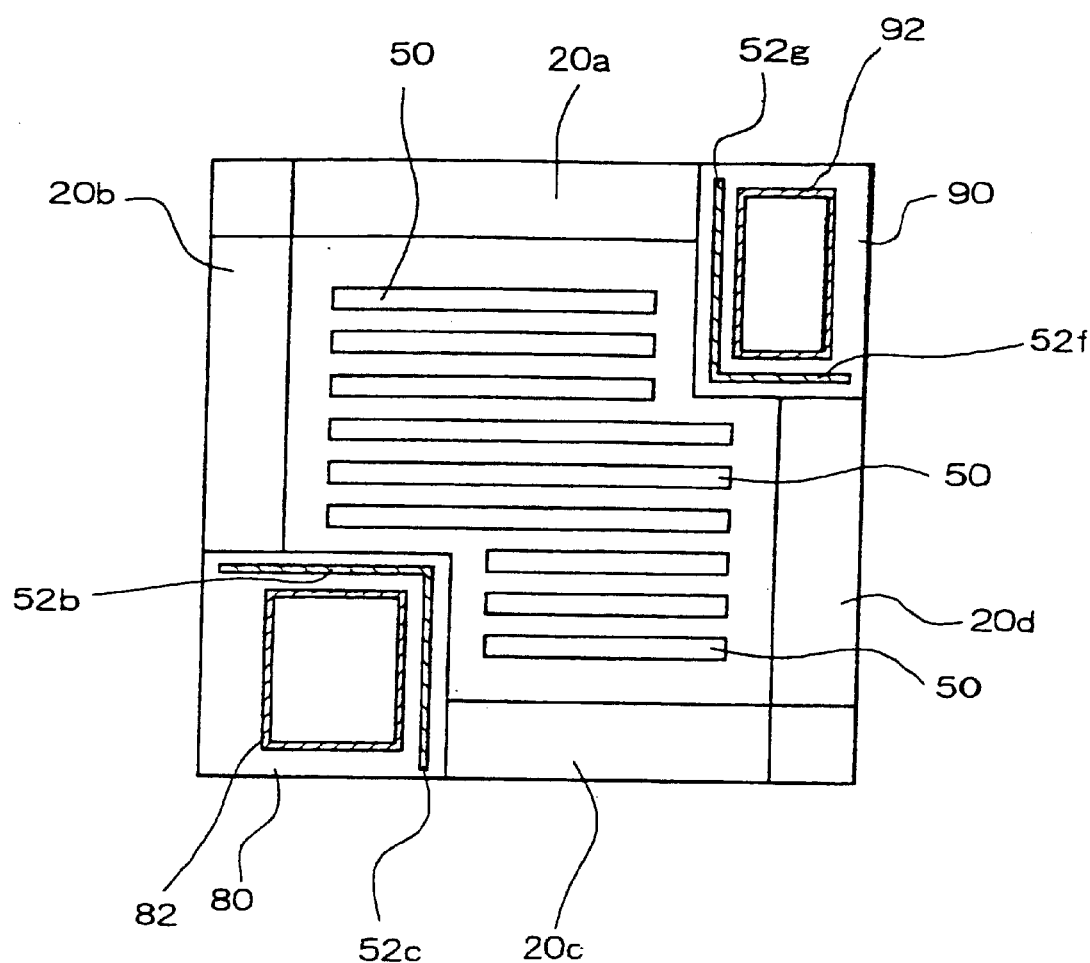
FIG. 11 is a plan view of an integrated circuit design region 10 in a third design step of the semiconductor integrated circuit 3 in accordance with the second embodiment of this invention.

The positions of the random logic circuit blocks 50 are then determined by the automated placement-routing program, as shown in FIG. 11.

Figure 12:
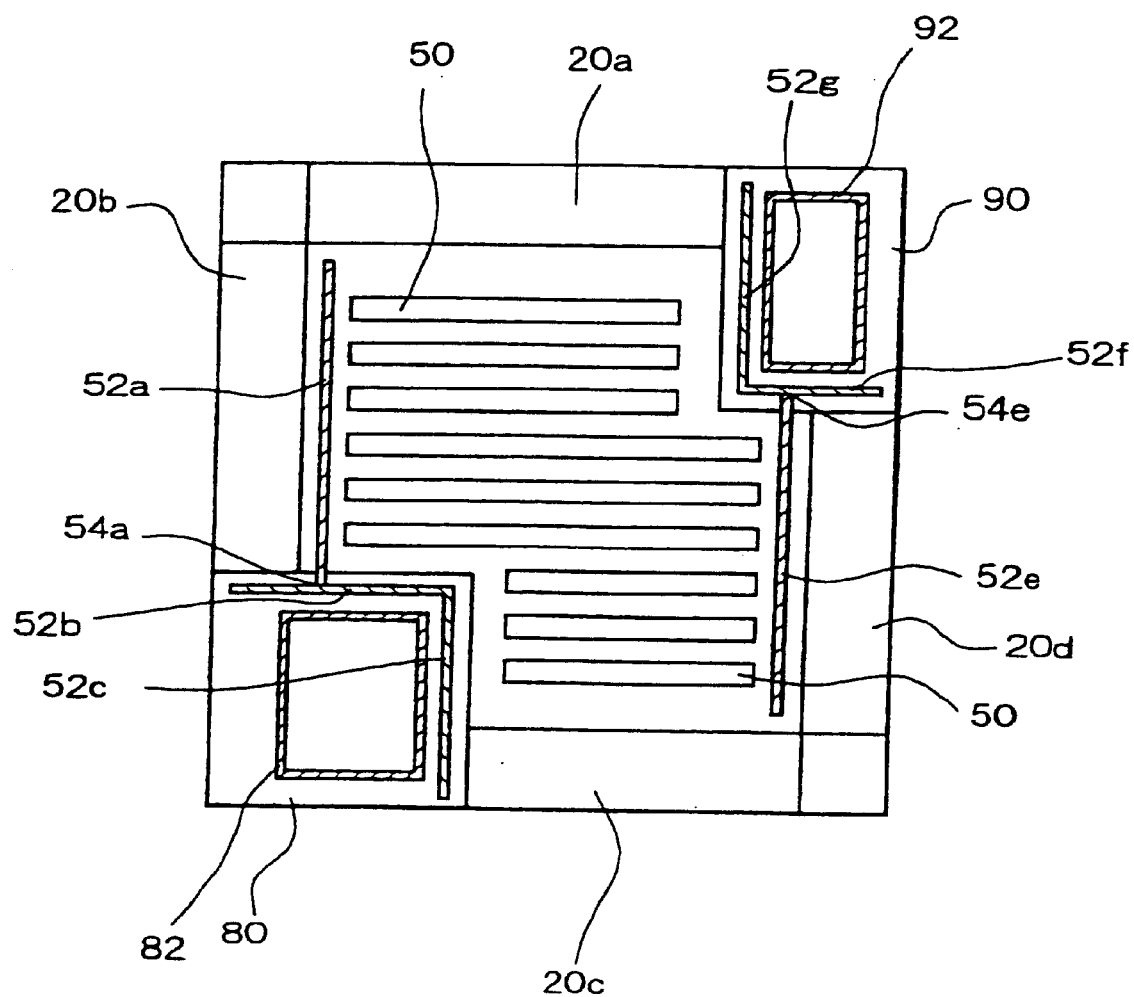
FIG. 12 is a plan view of an integrated circuit design region 10 in a fourth design step of the semiconductor integrated circuit 3 in accordance with the second embodiment of this invention.

The positions of the edges 52a and 52e of the encircling power wire 52 are determined by the automated placement-routing program, as shown in FIG. 12. This places the edge 52a so that it is connected to the edge 52b at the corner portion 54a and extends in the Y-direction. Similarly, the edge 52e is connected to the edge 52f at the corner portion 54e and is placed extending in the Y-direction.

The positions of the edges 52d and 52h of the encircling power wire 52 are determined by the automated placement-routing program, as shown in FIG. 13. This places the edge 52d so that it is connected to the edge 52c at the corner portion 54c and to the edge 52e at the corner portion 54d, and is placed extending in the X-direction. Similarly, the edge 52h is connected to the edge 52g at the corner portion 54g and the edge 52a at the corner portion 54h, and extends in the X-direction.

This completes the design of the semiconductor integrated circuit 3. The main effects of this embodiment of the invention will now be described. As shown in FIG. 13, the I/O port for the first circuit block 80 (or the second circuit block 90) is integrated with the first circuit block 80 (or the second circuit block 90) itself. This makes it possible to reduce the work involved with connecting the circuitry of the first circuit block 80 (or the second circuit block 90) to the I/O port for the corresponding first circuit block 80 (or the second circuit block 90) at the automated placement-routing stage.

In addition, the power wiring for the I/O port for the first circuit block 80 (or the second circuit block 90) is separated from that of the I/O ports 20a to 20d of the random logic circuit blocks 50. In this embodiment of the invention, the I/O ports are previously separated, so it is not necessary to separate the I/O ports at the automated placement-routing stage.

The edge 52b (or 52c) of the encircling power wire 52 is provided between the I/O port 20b (or 20c) and the I/O port for the first circuit block 80. For that reason, it is simple to separate the power systems of the power wires for the I/O port 20b (or 20c) and the I/O port for the first circuit block 80. Similarly, the edge 52f (or 52g) of the encircling power wire 52 is provided between the I/O port 20d (or 20a ) and the I/O port for the second circuit block 90. For that reason, it is simple to separate the power systems of the power wires for the 20d (or 20a) and the I/O port for the second circuit block 90.

What is claimed is:

1. A method of designing a semiconductor integrated circuit which comprises a first circuit block, a first power wire for supplying power to circuitry within the first circuit block, and a second power wire of a power system that differs from a power system of the first power wire, wherein the first power wire and a third power wire are provided within the first circuit block, wherein the third power wire has a bent portion, is separate from the first power wire, and has the same power system as the second power wire, the method comprising:

determining a position of the first circuit block; and
   automatically placing the second power wire such that the second power wire is connected to the third power wire after the step of determining a position of the circuit block,
   wherein the second power wire and the third power wire form a second encircling power wire, and
   wherein the first power wire comprises a first encircling power wire, wherein the first power wire is disposed outside the perimeter of the second encircling power wire.

2. The method of claim 1, wherein the third power wire is disposed adjacent to at least a portion of the periphery of the first power wire.

3. The method of claim 1, wherein the third power wire comprises:
   a first edge that extends in a first direction and is connected to the second power wire that extends in a second direction;
   a second edge that extends in the second direction and is connected to the first edge;
   a third edge that extends in the first direction and is connected to the second edge; and
   a fourth edge that extends in the second direction and is connected to the first and third edges;
   such that the first power wire is surrounded by the first to forth edges.

4. The method of claim 1, wherein a potential supplied by the first power wire differs from a potential supplied by a power wire that comprises the second power wire and the third power wire.

5. The method of claim 1, wherein a potential supplied by the first power wire is the same as a potential supplied by a power wire that comprises the second power wire and the third power wire.

6. The method of claim 1, wherein the first circuit block comprises a macro cell.

7. The method of claim 6, wherein the first circuit block comprises at least one of ROM, RAM, an analog circuit, a control circuit, and an interface circuit.

8. The method of claim 1, further comprising:
   determining a position of a second circuit block supplied with power by a power wire that comprises the second power wire and the third power wire, after said determining a position of the first circuit block.

9. The method of claim 8, wherein the second circuit block comprises a macro cell.

10. The method of claim 9, wherein the second circuit block comprises a random logic circuit.

11. The method of claim 8, wherein information on the first circuit block, information on the second circuit block, information on the first power wire, information on the second power wire, and information on the third power wire are stored in a library.

12. The method of claim 8, wherein positions of the first circuit block and the second circuit block are determined by automatic placement.

13. The method of claim 8, wherein the second circuit block includes a fourth power wire that supplies power to circuitry within the second circuit block.

14. The method of claim 1, wherein the semiconductor integrated circuit comprises at least one of a standard cell, a gate array, and an embedded array.

15. The method of claim 1, wherein the third power wire is non-rectangular shaped.

16. The method of claim 1, wherein the first power wire is disposed adjacent to at least a peripheral portion of the second encircling power wire.

17. The method of claim 1, wherein at least a portion of the third power wire is disposed adjacent to a portion of the perimeter of the first power wire.

18. A method of designing a semiconductor integrated circuit which comprises a first circuit block, a first power wire for supplying power to circuitry within the first circuit block, and a second power wire of a power system that differs from a power system of the first power wire, wherein the first power wire and a third power wire are provided with the first circuit block, wherein the third power wire has a bent portion, is separate from the first power wire, and has the same power system as the second power wire, wherein the third power wire comprises a first edge that extends in a first direction and that is connected to the second power wire that extends in a second direction, and a second edge that extends in the second direction and that is connected to the first edge, the method comprising:

determining a position of the first circuit block; and automatically placing the second power wire such that the second power wire is connected to the third power wire after said determining a position of the circuit block, wherein the second power wire and the third power wire form a second encircling power wire, and wherein the first power wire comprises a first encircling power wire that is disposed outside the perimeter of the second encircling power wire.

19. The method of claim 18, wherein the first circuit block is integrated with a first I/O port for the first circuit block.

20. The method of claim 19, wherein the first edge and the second edge are provided between the first I/O port and a second I/O port.

21. The method of claim 18, wherein the third power wire is disposed adjacent to at least a portion of the periphery of the first power wire.

22. The method of claim 18, wherein the third power wire is non-rectangular shaped.

23. The method of claim 18, wherein the first power wire is disposed adjacent to at least a peripheral portion of the second encircling power wire.

24. The method of claim 18, wherein the third power wire comprises:

a first edge that extends in a first direction and is connected to the second power wire that extends in a second direction;

a second edge that extends in the second direction and is connected to the first edge;

a third edge that extends in the first direction and is connected to the second edge; and a fourth edge that extends in the second direction and is connected to the first and third edges;

such that the first power wire is surrounded by the first to fourth edges.

25. The method of claim 18, wherein a potential supplied by the first power wire differs from a potential supplied by a power wire that comprises the second power wire and the third power wire.

26. The method of claim 18, wherein a potential supplied by the first power wire is the same as a potential supplied by a power wire that comprises the second power wire and the third power wire.

27. The method of claim 18, wherein the first circuit block comprises a macro cell.

28. The method of claim 27, wherein the first circuit block comprises at least one of ROM, RAM, an analog circuit, a control circuit, and an interface circuit.

29. The method of claim 18, further comprising:

determining a position of a second circuit block supplied with power by a power wire that comprises the second power wire and the third power wire, after said determining a position of the first circuit block.

30. The method of claim 29, wherein the second circuit block comprises a macro cell.

31. The method of claim 30, wherein the second circuit block comprises a random logic circuit.

32. The method of claim 29, wherein information on the first circuit block, information on the second circuit block, information on the first power wire, information on the second power wire, and information on the third power wire are stored in a library.

33. The method of claim 29, wherein positions of the first circuit block and the second circuit block are determined by automatic placement.

34. The method of claim 18, wherein the semiconductor integrated circuit comprises at least one of a standard cell, a gate array, and an embedded array.

35. The method of claim 18, wherein at least a portion of the third power wire is disposed adjacent to a portion of the perimeter of the first power wire.

36. A method of designing a semiconductor integrated circuit, comprising:

determining a position of a first circuit block;

providing the first circuit block;

providing a first power wire for supplying power to circuitry within the first circuit block, wherein the first power wire is provided within the first circuit block;

providing a third power wire within the first circuit block, wherein the third power wire is separated from the first power wire, wherein the third power wire has the same power system as a second power wire, and wherein the third power wire has a bent portion, part of which extends in a first direction;

determining a position of a second circuit block; and then automatically placing the second power wire that extends in a second direction such that the second power wire is connected to the third power wire, wherein the second power wire is of a power system that differs from a power system of the first power wire, wherein the second circuit block is supplied with power by a second encircling power wire that comprises the second power wire and the third power wire, and wherein the first power wire comprises a first encircling power wire that is disposed outside the perimeter of the second encircling power wire.

37. The method of claim 36, wherein the third power wire is placed on the outer side of the first power wire.

38. The method of claim 36, wherein the bent portion of the third power wire comprises a first edge and a second edge, wherein the first edge extends in the first direction and is adapted to be connected to the second power wire, and wherein the second edge extends in the second direction and is connected to the first edge.

39. The method of claim 38, wherein the first circuit block is integrated with a first I/O port for the first circuit block.

40. The method of claim 39, wherein the first edge and the second edge are provided between the first I/O port and a second I/O port.

41. The method of claim 36, wherein the third power wire comprises:
- a first edge that extends in a first direction and is connected to the second power wire that extends in a second direction;
- a second edge that extends in the second direction and is connected to the first edge;
- a third edge that extends in the first direction and is connected to the second edge; and
- a fourth edge that extends in the second direction and is connected to the first and third edges;
- such that the first power wire is surrounded by the first to fourth edges.

42. The method of claim 36, wherein a potential supplied by the first power wire differs from a potential supplied by a power wire that comprises the second power wire and the third power wire.

43. The method of claim 36, wherein a potential supplied by the first power wire is the same as a potential supplied by a power wire that comprises the second power wire and the third power wire.

44. The method of claim 36, wherein the first circuit block comprises a macro cell.

45. The method of claim 44, wherein the first circuit block comprises at least one of ROM, RAM, an analog circuit, a control circuit, and an interface circuit.

46. The method of claim 36, wherein the second circuit block comprises a macro cell.

47. The method of claim 46, wherein the second circuit block comprises a random logic circuit.

48. The method of claim 36, wherein information on the first circuit block, information on the second circuit block, information on the first power wire, information on the second power wire, and information on the third power wire are stored in a library.

49. The method of claim 36, wherein positions of the first circuit block and the second circuit block are determined by automatic placement.

50. The method of claim 36, wherein the semiconductor integrated circuit comprises at least one of a standard cell, a gate array, and an embedded array.

51. The method of claim 36, wherein the third power wire is disposed adjacent to at least a portion of the periphery of the first power wire.

52. The method of claim 36, wherein the third power wire is non-rectangular shaped.

53. The method of claim 36, wherein the second circuit block includes a fourth power wire that supplies power to circuitry within the second circuit block.

54. The method of claim 36, wherein the first power wire is disposed adjacent to at least a peripheral portion of the second encircling power wire.

55. The method of claim 36, wherein at least a portion of the third power wire is disposed adjacent to a portion of the perimeter of the first power wire.

* * * * *